United States Patent [19]

Halstead et al.

[11] 4,365,194
[45] Dec. 21, 1982

[54] CONVERTIBLE MULTIRATE DIAL REGISTER FOR ENERGY CONSUMPTION METERS

[75] Inventors: Kenneth G. Halstead; Eugene C. Benbow, both of Raleigh, N.C.; Forrest E. Coyle, Penn Hills, Pa.

[73] Assignee: Westinghouse Electric Corp., Pittsburgh, Pa.

[21] Appl. No.: 167,953

[22] Filed: Jul. 14, 1980

[51] Int. Cl.³ .................... G01R 15/08; G01R 11/64
[52] U.S. Cl. ................................ 324/116; 324/103 R
[58] Field of Search ........................... 324/116, 103 R

[56] References Cited

U.S. PATENT DOCUMENTS 593,852 11/1897 Oxley ................................ 324/116
1,906,299 5/1933 Zenkner ............................ 324/116

Primary Examiner—Ernest F. Karlsen
Attorney, Agent, or Firm—Robert E. Converse, Jr.

[57] ABSTRACT

A multirate dial register for meters having a rotatable measuring element includes plural sets of dial indicators having at least one set thereof selectively coupled by a clutch mechanism to the measuring element such that the ratio of measuring indications at the one set of dial indicators is controllable at the front of the register for converting between measurements of different parameters of a measured quantity by a solenoid actuated clutch wherein one solenoid plunger end controls the clutch and the opposite plunger end controls an on-off dial indicator.

15 Claims, 9 Drawing Figures

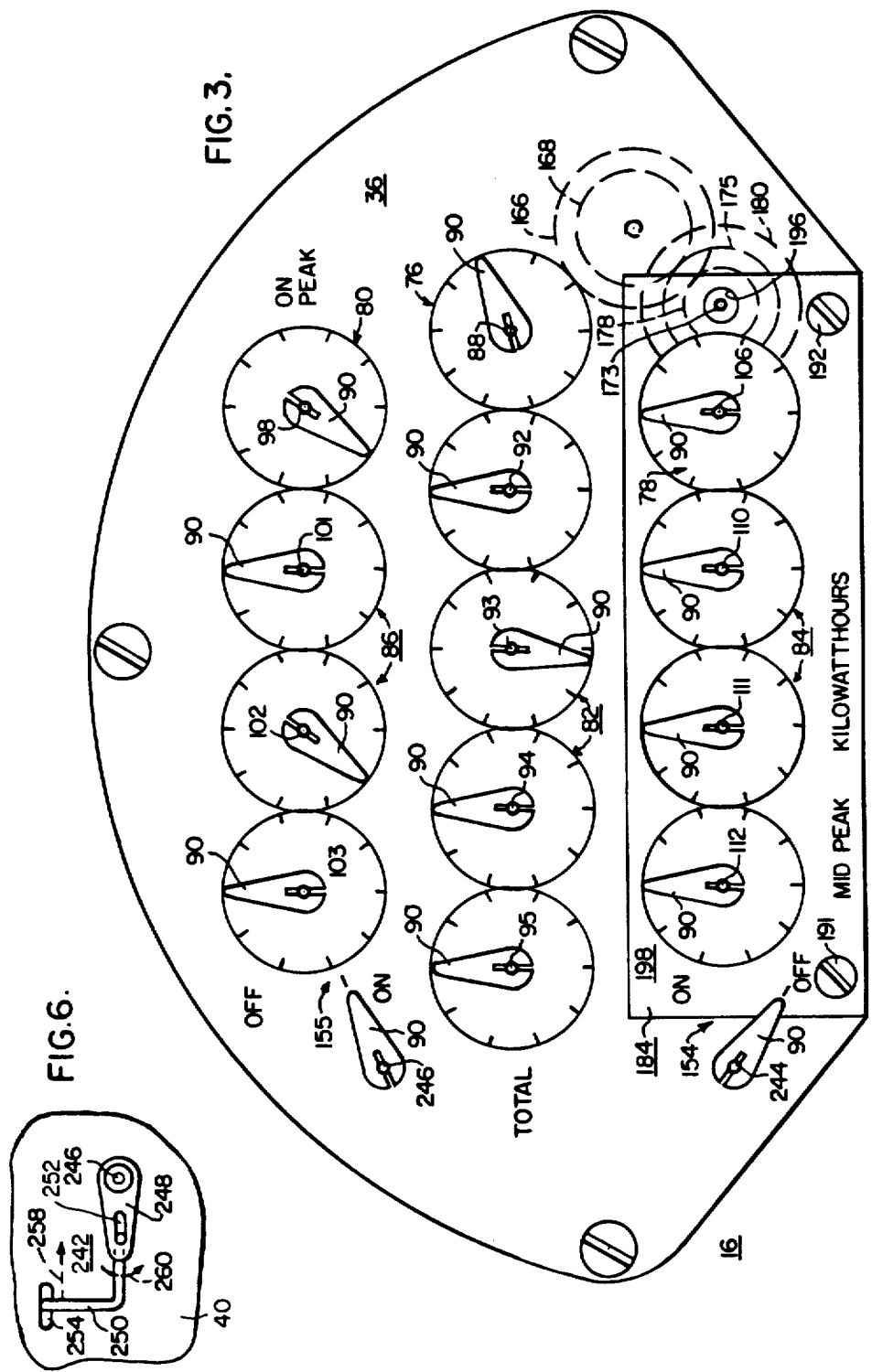

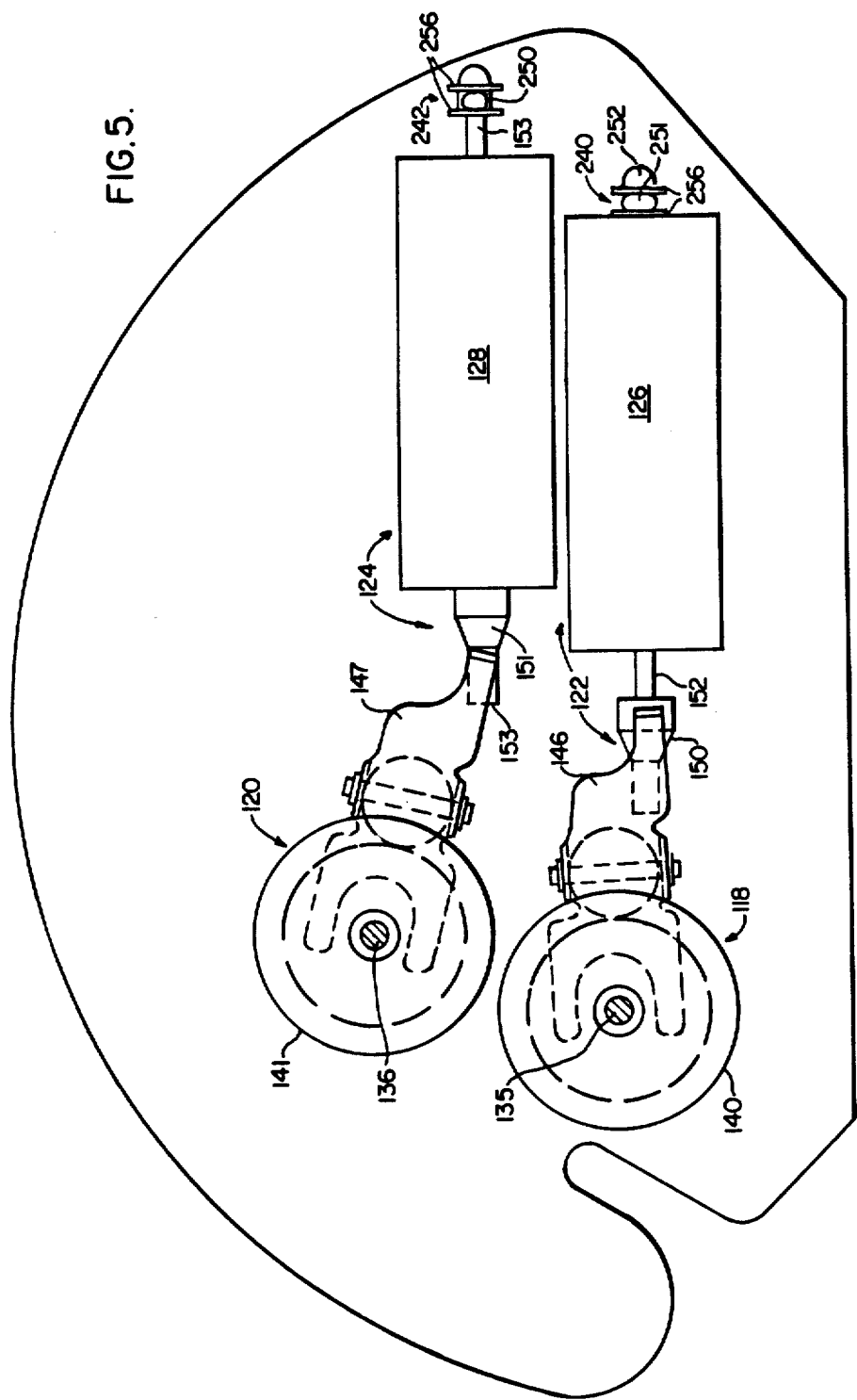

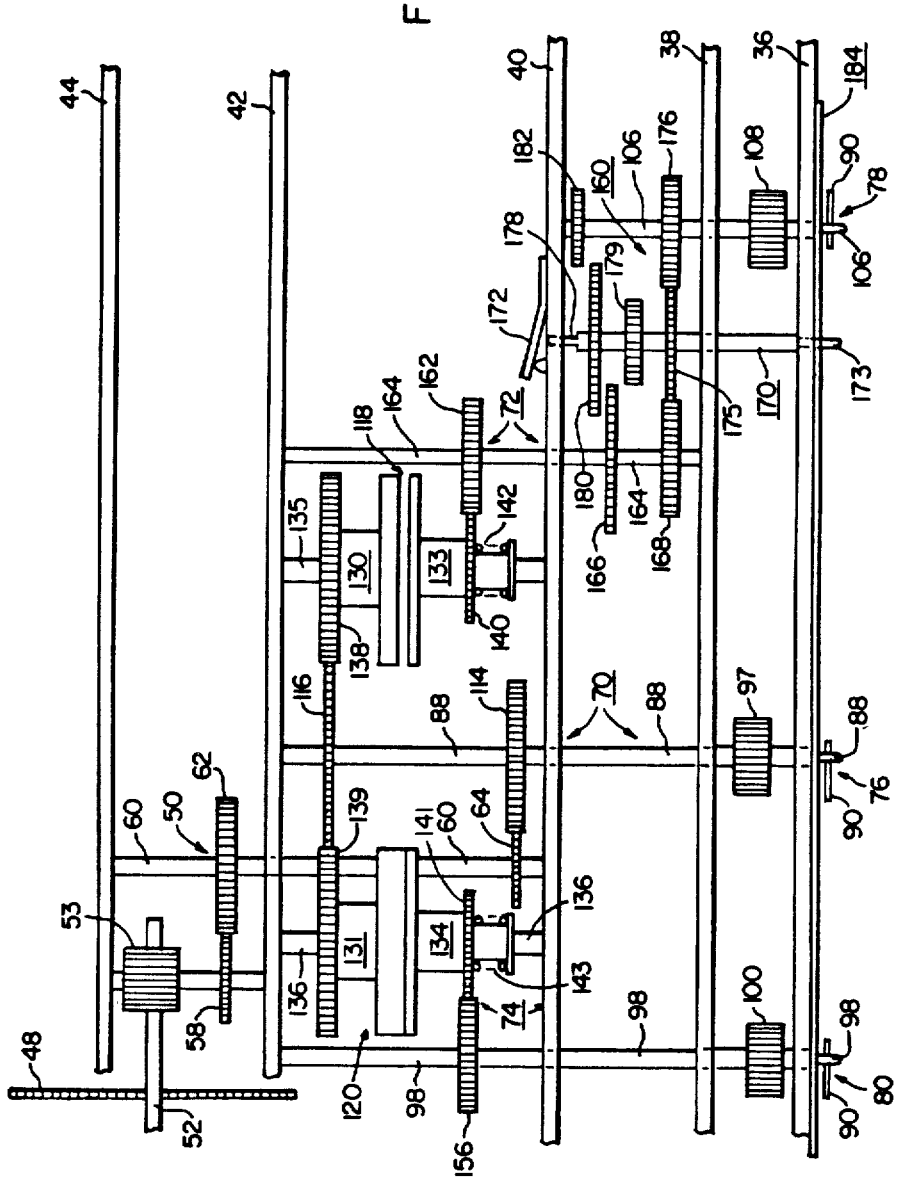

CONVERTIBLE MULTIRATE DIAL REGISTER FOR ENERGY CONSUMPTION METERS

CROSS-REFERENCE TO RELATED APPLICATIONS

This invention is related to application Ser. No. 167,952, for Improved Clutch Mechanism For Time of Day Watthour Meter Registers and application Ser. No. 167,954, now U.S. Pat. No. 4,320,371, for Tractive Solenoid Device, filed concurrently with this application.

BACKGROUND OF THE INVENTION

This invention relates to the field of multirate meter dial registers and more particularly to such multirate dial registers of the time-of-day type having easily changeable gear ratios for alternatively providing measurement of different parameters of a consumption quantity to be measured or measurements of a given parameter at different time intervals.

The measurement of a consumption quantity such as electric energy for billing purposes often includes the use of a meter having a basic measuring unit such as found in a watthour meter movement having a rotating measuring element. The rate of rotation of the element is proportional to the flow of the energy quantity to be measured. Detachable dial register units are known which are removably mounted to the measuring unit so as to enable quick and easy conversion of a meter for different modes of measurement indicated at one or more sets of dials on the front of the register. In electric energy meters, different detachable dial registers are commonly provided for measuring electric consumption in kilowatthours, maximum electric power demand in kilowatts, and/or a combination of both kilowatthours and maximum kilowatt demand. Further detachable dial registers are provided for measuring a consumption quantity at plural sets of dials in which one or more of the sets of dials are selectively activated on a time-related basis so that different billing rates can be applied to energy consumption during different times. The time-of-day measurements typically are scheduled to correspond to the peak loads on a supplying system or source such as experienced by an electric power distribution system. In U.S. Pat. No. 3,913,014 for "Demand Meter For On-Peak Maximum Demand Metering" issued Oct. 14, 1975 and assigned to the assignee of this invention, a dial register is described for electric energy measurement in kilowatthours and time controlled measurement of electric power in kilowatts. On-off demand metering times are varied by interchangeable cams driven by a timing motor. In U.S. Pat. No. 4,128,807 for "Multidial Electric Meter Register" issued Dec. 5, 1978 and assigned to the assignee of this invention a multidial register is described having a solenoid controlled gear shifting arrangement for effecting on-peak and off-peak or time-of-day kilowatthour and maximum kilowatt demand metering. Both of the last noted dial registers include separate sets of dials to provide the separate kilowatthour and kilowatt demand measurements.

SUMMARY OF THE INVENTION

In accordance with the present invention a convertible multirate dial register for energy billing meters includes at least one set of dials for metering total energy consumption and one or more sets of dials capable of periodic or time-of-use related metering of either maximum power demand or energy consumption. A rotatable measuring element of a watthour meter movement continuously drives a first dial gear train of the register and an associated first set of dials in response to the rate of consumption of the measured quantity. Each of a second and an optional third dial gear train includes a clutch mechanism for selective coupling to the first dial gear train, preferably during predetermined time-of-day schedules, for selectively driving an associated second set of dials and, optionally, an associated third set of dials. A gearshift mechanism is connected to at least the second dial gear train and the associated clutch mechanism to provide alternative gear ratios at the associated second set of dials. Preselected measuring ratios at the second set of dials may be simply changed by operating the gear shift mechanism at the front plate of the register. Thus, either metering of different parameters of the measured electric consumption quantity can be provided at the separate sets of dials or the same parameter can be metered on different time schedules at the separate sets of dials.

A general feature of the present invention is to provide a more flexible, versatile and adaptive multirate register for energy billing meters to accommodate different metering needs without exchanging different parts of the register while maintaining compact and rugged design features and reliable operation required for extended metering use under widely varying ambient conditions. Another feature of this invention is to provide a multirate dial register for use in an electric energy billing meter including a rotating measuring element so that a first register dial gear train continuously drives a first set of kilowatthour dials and a second register dial gear train including both gearshift and clutch mechanisms selectively drives a second set of dials at either of at least two predetermined gear ratios for maximum kilowatt demand or kilowatthour measurements. A further feature of this invention is to provide a dial gear train including a gearshift mechanism having a slidable gear shaft exposed at the register front plate so that reverse mounted positions of an auxiliary dial plate displays alternative dial markings for indicating either maximum kilowatt demand or kilowatthour measurements by the associated dial indicators and further provides selective engagement with the slidable shaft to effect a desired gear train measuring ratio corresponding to the measurement and dial markings indicated on the exposed face of the auxiliary plate. A still further feature of this invention is to provide a multirate register with a solenoid clutch actuator for at least one clutch-operated gear train wherein a common armature plunger controls both a dial status indicator on the register front face and the coupling and uncoupling states of the clutch.

These and other features and advantages of the present invention will be apparent from the detailed description of the preferred embodiment shown in the drawings.

BRIEF DESCRIPTION OF THE DRAWINGS

FIG. 3 is a front elevational view of the multirate dial register shown in FIG. 1;

FIG. 5 is a back view of the multirate dial register taken along the axis V—V in FIG. 1 and looking in the direction of the arrows, with parts removed;

FIG. 6 is a fragmentary view taken along the axis VI—VI in FIG. 1 looking in the direction of the arrows;

FIG. 7 is a top view of an illustrative gear train layout corresponding to the multirate dial register shown in FIG. 1 for better depicting the operative relationships of the gear trains included in the present invention;

DESCRIPTION OF THE PREFERRED EMBODIMENT

Figure 1:
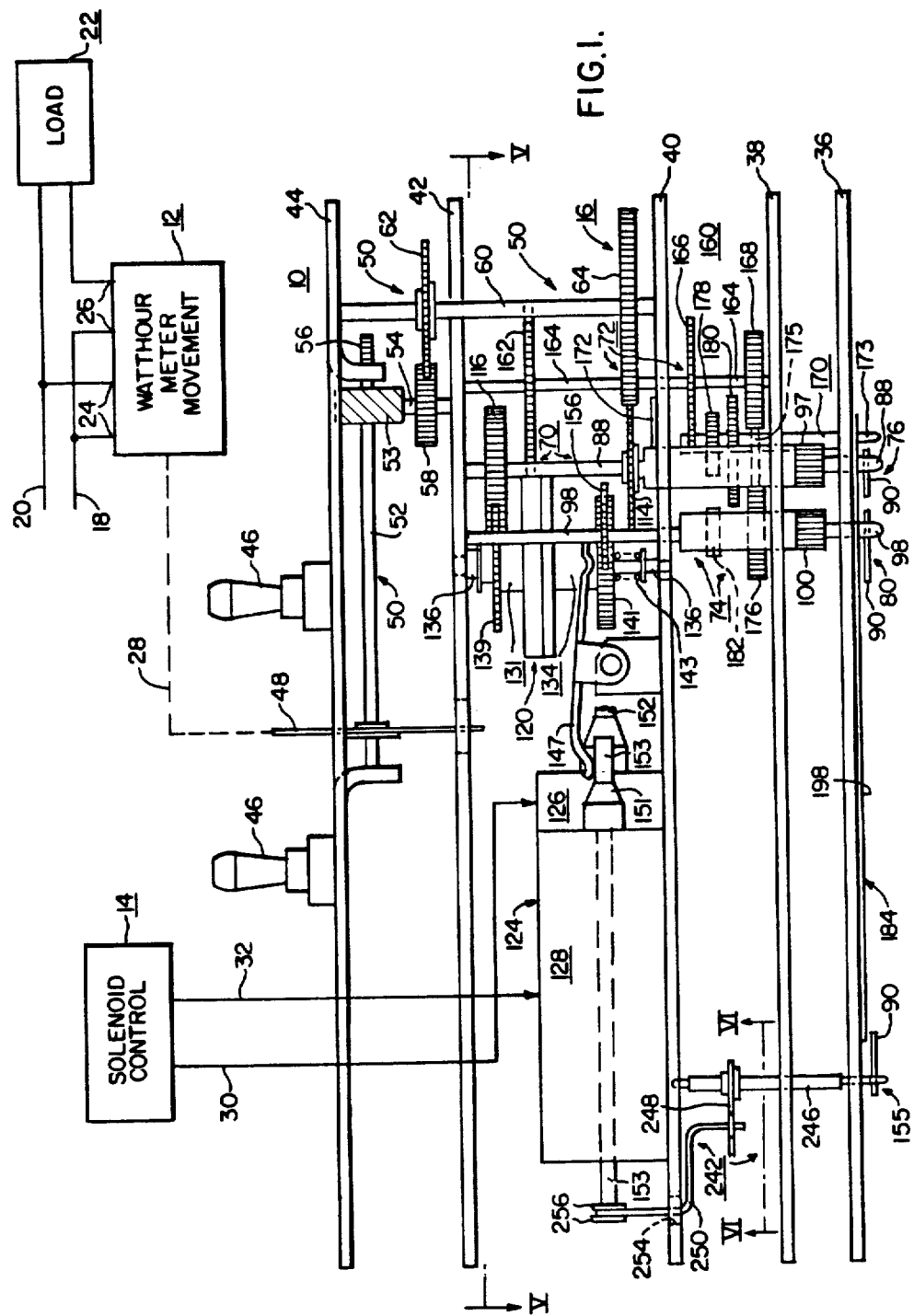
FIG. 1 is an electric energy meter, partially shown in block schematic form, including a convertible multirate dial register shown in a top elevational view with parts removed as made in accordance with this invention.

Referring now to the drawings wherein the same numeral indicates the same or identical parts throughout the drawings and more particularly to FIG. 1 an electric energy billing meter 10 is shown therein including a watthour meter movement indicated by the schematic block 12 and a solenoid control unit indicated by the schematic block 14 and a multirate dial register 16 illustrated in a top elevational view and made in accordance with the present invention. The meter 10 is shown connected for measuring an electric energy consumption quantity to be measured supplied through the power line conductors 18 and 20 from the distribution system of an electric utility company supplying an electric load 22. The watthour meter movement 12 is of an electromechanical integrating type having therein voltage and current electromagnetic sections connected to a pair of voltage inputs 24 and a pair of current inputs 26 connected with the power line conductors 18 and 20 as shown. In accordance with the wellknown operation of induction type watthour meter movements, a rotatable measuring element having shaft output, represented by the broken line 28 is conventionally formed by an electro-conductive disc supported by a shaft which is magnetically driven by the electromagnetic sections of the meter movement 12. Thus, a rotating shaft output 28 of the rotatable measuring element is rotated at a rate corresponding to the rate of electric energy consumption by the load 22.

The watthour movement 12 and the multirate dial register 16 are typically carried by a frame, not shown, enclosed by a housing including a base for providing detachable mounting at a socket in electrical contact with the power line conductors 18 and 20 and further including a housing cup-shaped cover providing a limited space for weathertight protection of the meter parts including the register 16. The solenoid control unit 14, described further hereinbelow, is either carried within the common meter housing or provided externally of the meter 10 and provided with conductors represented by the lines 30 and 32 from the unit 14 to the housing of the meter 10. It is contemplated that certain of the important features of the invention may be practiced without the use of the solenoid control unit 14.

The multirate dial register 16 includes a support assembly including a front dial plate 36, a sub plate 38, middle plate 40, ratio plate 42 and a back plate 44. The plates 36 through 44 are connected together in a parallel fashion by innerplate spacers, not shown, and machine screws and nuts or rivets, also not shown, in a conventional fashion. The back plate 44 includes a pair of bayonet projections 46 for detachably and removably mounting the multidial register 16 to the frame, not shown, of the meter 10 so that the first gear 48 of the register input gear train 50 is in meshing engagement with the meter shaft output 28 included in the rotatable measuring element driven by movement 12. The detachable mounting of the multirate dial register 16 is the same as the conventional mounting of watthour meter registers so that different parameters such as total kilowatthours, time of day kilowatthours, block interval kilowatt demand, cumulative maximum kilowatt demand, time of day maximum kilowatt demand and the like may be provided. Accordingly, registers such as described in the aforementioned U.S. Pat. Nos. 3,913,014 and 4,128,807 are mountable for driving engagement with the watthour meter movement 12 in the same detachable mounting arrangement. It is to be noted that it is an important feature of the present invention to provide alternate modes of dial register metering without requiring separate registers as described more fully hereinbelow.

For purposes of explaining the remaining portions of the present invention, the first gear 48 of the gear train 50 will be assumed to be rotated by the meter movement 12 by the associated rotatable measuring element shaft, indicated by the broken line 28, at a rate proportional to the rate of consumption of electric energy flowing in the conductors 18 and 20. Thus, each complete rotation of a gear 48 is proportional to a predetermined quantum of electric energy consumption. The remaining portion of the input gear train 50 includes a shaft 52 carrying the gear 48 and a worm gear 53. A shaft 54 is further provided for fixedly carrying a gear 56 hidden in FIGS. 1 and 7 but shown in FIG. 2 driven by the worm gear 53 of the shaft 52. The shaft 54 also carries another gear 58. A shaft 60 carries a gear 62 driven by the gear 58 and further carries a gear 64 providing the output of the input gear train 50.

Having described the input gear train 50, being of a substantially conventional arrangement for meter dial register input gear trains, the plural dial gear trains forming principal parts of the multirate dial register 16 of this invention are described further hereinafter. It is initially noted that the FIGS. 1 and 2 and the broken line gear locations in FIG. 3 are the operative placements of the gear trains in one preferred embodiment of the register 16. Further noted initially, is a gear train layout illustration shown in FIG. 7 which is a fragmentary showing of corresponding parts of the multirate dial register 16 laid out substantially flat. The simpler layout of FIG. 7 includes the gear train parts in the same operative relationships as in the multirate dial register 16 with like or corresponding parts being designated by the same numeral but reoriented for easier understanding.

In the more general aspects of the register 16 of this invention, the input gear train 50 continuously drives a first and total watthour dial gear train 70 and, in turn, the gear train 70 provides an input to an intermittently driven second and alternatively mid-rate (mid peak watthour) or high rate (on peak) watt demand dial gear train 72. Concurrently, the first dial gear train 70 provides the input to an intermittently driven third and high rate (on peak) dial gear train 74. The outputs of the first, second and third dial gear trains 70, 72 and 74 are measuring dial indicators 76, 78 and 80, respectively. The dial indicators 76, 78 and 80 are the lowest order or least significant decimal dial indicators of three sets 82, 84 and 86, respectively, of decade related clock type dial indicators shown in FIG. 3. The middle dial indicator set 82 is the total kilowatthour (KWH) measuring set; the bottom dial indicator set 84 is the mid peak kilowatthour (KWH) measuring set or, alternatively, the on peak kilowatt (KW) maximum demand measuring set; and the top dial indicator set 86 is the on peak KWH measuring set, in one preferred embodiment. The dial indicator 76 includes a first output shaft 88 of the gear train 70 having a reduced end extending through the front plate 36 and carrying one of a plurality of pointers 90. Frictional mounting of each of the pointers 90 on a separate one of shaft ends extending through the front face 36 facilitates their assembly thereto and disassembly therefrom in a well-known manner. Pointer carrying shafts 92, 93, 94 and 95 are included in addition to the shaft 88 in the dial indicator set 82 extending through the centers of decimal dial indicia or markings having indicia for indicating each tenth of a pointer's measuring rotation. The shafts 88 and 92 through 95 inclusive, have decade relations in a known manner and the shafts 92 through 95 are driven by a pinion gear 97 of the shaft 88 shown in FIGS. 1 and 7.

In a manner corresponding to the middle and first dial indicator set 82, the top and third dial indicator set 86 is driven by the third dial gear train 74 including a first output shaft 98 having a reduced diameter at the forward end extending through the front plate 36 and carrying one of the pointers 90 included in the dial indicator 80 of the dial indicator set 86 shown in FIG. 3. A pinion gear 100 of FIGS. 1 and 7 is carried by the shaft 98 to drive the shafts 101, 102 and 103 of the dial indicator set 86, shown in FIG. 3, of the third dial gear train 74, shown in FIGS. 1 and 7. The bottom and second dial gear train 72 includes in a fashion corresponding to the gear trains 70 and 74, a first output shaft 106 shown only in FIGS. 3, 7 and 8, carrying a pinion gear 108, shown in FIG. 7, for driving in a decade related fashion the shafts 110, 111 and 112, shown in FIG. 3, having reduced ends extending through the front plate 36 and carrying separate ones of the pointers 90 of the dial indicator set 84.

Figure 2:
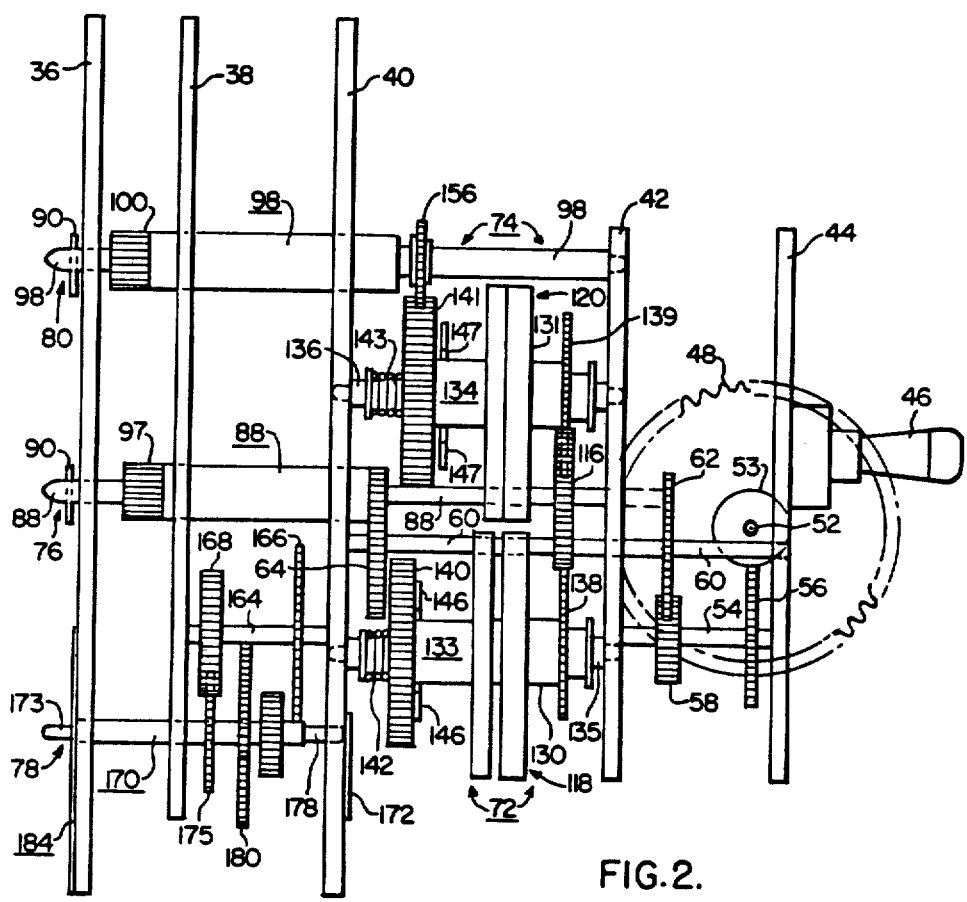
FIG. 2 is a side elevational view with parts removed of the multirate dial register shown in FIG. 1.

To effect the measuring rotation of the first dial gear train 70 shown in FIGS. 1 and 7 from the measuring element output 28, a gear 114 is fixed to the shaft 88 so as to be in a continuously driven engagement with the output gear 64 of the register input gear train 50. The shaft 88 is rotated to drive its associated dial indicator 76 and the remaining dial indicators of the set 82 from the gear 97. Thus, totalization of the rotation of the measuring element output 28 is accumulated by the dial indicator set 82 and indicated in kilowatthours. A gear 116 is fixed to the rear end of the shaft 88 as shown in FIGS. 1, 2 and 7 to provide an input to the second and third dial gear trains 72 and 74 as best shown in FIG. 7. The second and third dial gear trains 72 and 74 are capable of intermittent or discontinuous driving relationsips between the first dial gear train 70 and the two sets of dial indicators 84 and 86, respectively, by operation of first and second clutch mechanisms 118 and 120 included in each of the latter two gear trains. The clutch mechanisms 118 and 120 are described in detail and claimed in the aforementioned related application Ser. No. 167,952. Each of the clutch mechanisms 118 and 120 is associated with a clutch operating arrangement designated 122 and 124 in FIG. 5 and each of the arrangement includes one of the solenoid actuators 126 and 128 noted in the application Ser. No. 167,952, or the improved solenoid device described in the aforementioned related application Ser. No. 167,954, now U.S. Pat. No. 4,320,371, may be used.

Before further describing the second and third dial gear trains 72 and 74 of the present invention, the clutch mechanisms 118 and 120 and the associated operating arrangements 122 and 124 are briefly described by reference to FIG. 7 where both clutch mechanisms are shown and also to FIGS. 1, 2 and 5 showing either wholly or partially the clutch mechanisms 118 and 120 and the associated operating arrangements 122 and 124 as they are physically arranged and mounted in the register 16. The clutch mechanisms 118 and 120 include input or clutch driving parts 130 and 131 and output or clutch driven and brake parts 133 and 134. The clutch driving and driven parts are mounted for free rotation and in overriding relationships on the shafts 135 and 136 of the gear trains 72 and 74, respectively. Clutch input gears 138 and 139 are carried by the clutch parts 130 and 131, respectively, and clutch output gears 140 and 141 are carried by the clutch parts 133 and 134, respectively. The clutch parts 133 and 134 are axially movable relative to the clutch parts 130 and 131, respectively. Biasing springs 142 and 143 produce the clutch closed and coupling states between the clutch parts 130-133 and the clutch parts 131-134. The clutch input gears 138 and 139 are both arranged to be in continuous meshing engagement with the gear 116 so as to be continuously driven by the first dial gear train 70. Thus, in the biased together or closed positions of the clutch mechanisms 118 and 120, substantially no slippage occurs therebetween and the rotational torque applied to the gears 138 and 139 by the gear 116 is transmitted across the clutch coupling and mating clutch engaging surfaces to the output gears 140 and 141, respectively. The clutch mechanism 118 is shown in the drawings in the open and uncoupling state and the clutch mechanism 120 is shown in the closed and coupling state for purposes of this description.

To effect the coupling and uncoupling states and to provide a clutch braking feature, the clutch operating arrangements 122 and 124 operate as described in the application Ser. No. 167,952, and briefly reviewed hereinafter. The clutch operating arrangements 122 and 124, as shown in FIGS. 1, 2 and 5, include trip lever arms 146 and 147 pivotally mounted on the register middle plate 40. The driving end of the lever arms 146 and 147 have a forked configuration defining tines extending over the cylindrical sleeve portion of the clutch parts 133 and 134 so that the ends of the tines are releasably engageable with the back or inner radial surfaces of the gears 140 and 141. The driving ends of the lever arms 146 and 147 are swingingly rotated by the bistable solenoid actuators 126 and 128, respectively, as shown in FIGS. 1 and 5 having reciprocally movable cams 150 and 151 carried by solenoid plungers 152 and 153, respectively, for engaging the driven ends of the trip levers 146 and 147, respectively. The armatures 152 and 153 are reciprocally movable so that an increasing diameter or frustoconical camming surface of the cams 150 and 151 and a smaller straight diameter surface thereof move the driven end of the trip levers 146 and 147 arcuately to engage and disengage the gears 140 and 141, respectively.

The solenoid actuators 126 and 128 include electromagnetic coils, not shown, which are energized by suitable electrical signals supplied by the solenoid control unit 14 shown in FIG. 1. In one clutch control state, the plungers are positioned to effect the clutch closed positions and in another control state, they effect a clutch opened positions. The clutch closed state is produced by the plungers being shifted to the retracted position so that the trip levers 146 and 147 assume a rotated position to be released from the sides of the gears 140 and 141 so that the springs 142 and 143 are permitted to bias or urge the clutch driving and driven parts together. In another control state of the solenoid actuators 126 and 128, the plungers are extended so that the large diameter surface of the cams carried thereon pivotally rotate the lever arms so as to bias the gears 140 and 141 against the associated springs 142 and 143 to release and disengage the clutch parts 133 and 134 from the clutch parts 130 and 131. In the clutch open positions, the clutch parts 130 and 131 idle on the shafts 135 and 136 presenting low or negligible torque on the first dial gear train 70 and the measuring element output 28 driven by the meter movement 12.

To provide the braking or rotational locking and arresting feature in the clutch mechanisms 118 and 120, the frictional engagement of the forked ends of the trip levers 146 and 147 with the radial sides of the gears 140 and 141, when the trip levers are rotated to the clutch opening position, prevents rotation of the clutch parts 133 and 134. The springs 142 and 143 strongly bias the sides of the gears 140 and 141 against the forked ends of the trip levers because of the increased compressed state of the springs. The spring biasing forces provide the strong frictionally locking force clamping the gears 140 and 141 to the ends of the trip levers to rotationally retain the output clutch parts and arrest rotation of the output portions of the dial gear trains 72 and 74 to prevent wandering or spurious movements of the pointers at the dial indicators of the second and third sets of dial indicators 84 and 86 during non-measuring or off peak periods thereof.

As described in detail further hereinbelow, the solenoid actuators 126 and 128 uniquely provide operation of two on-off dial indicators 154 and 155, respectively, shown in FIG. 3. Briefly, as the closed and opened states of the clutch mechanisms 118 and 120 are produced by the solenoid actuators 126 and 128, the on-off dial indicators 154 and 155 indicate that the associated sets of measuring dial indicators 84 and 86, respectively, are active ("on") or inactive ("off").

Having described the clutch mechanisms 118 and 120 and the associated clutch operating arrangements 122 and 124 as included in the second and third dial gear trains 72 and 74, the remaining parts of these gear trains are described hereinafter. The third dial gear train 74, shown FIGS. 1, 2 and 7, has been almost explained hereinabove except for the gear 156 fixed to the shaft 98 for continuously meshing engagement with the clutch output gear 141. The meshing engagement exists while the gear 141 is actually shifted with the opening and closing movements of the part 133 of the clutch mechanism 120. Thus, the coupling and uncoupling states of the clutch mechanism 120 connects and disconnects the input rotations thereof by the first dial gear train 70, as provided at the input clutch gear 139 input to the third dial gear train 74, with the on peak KWH totalizations of the top and third set of dial indicators 86 shown in FIG. 3.

Figure 8:
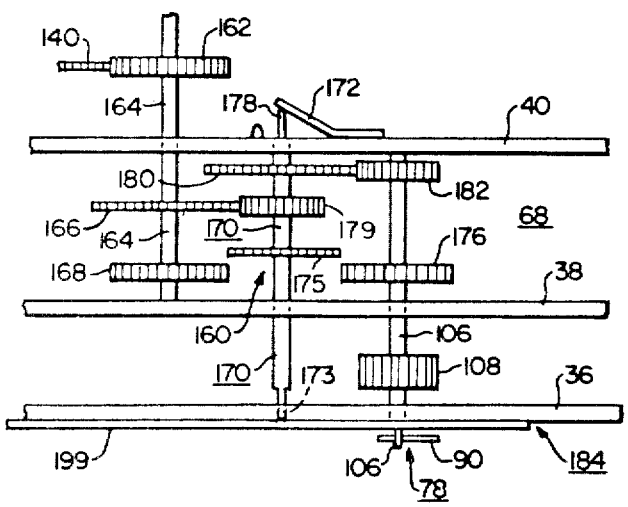
FIG. 8 is a partial view of the illustration shown in FIG. 7 wherein the multirate dial register is in a different mode of operation.

The second dial gear train 72 shown at the bottom in FIGS. 1, 2, 7 and 8 includes a slidable gear shift mechanism 160 forming an important feature of this invention as described hereinbelow. The rotations of the input clutch gear 138 to the third dial gear train 72 is coupled by the clutch mechanism 118 to the output clutch gear 140 so it is in continuous meshing engagement with a gear 162. The continuous meshing engagement is provided throughout the axial movement of the clutch part 133. The gear 162 is fixed to a shaft 164 of the second dial gear train 72. The shaft 164 also carries the different diameter gears 166 and 168 providing either of two driving inputs to the gear shift mechanism 160, as best seen in FIGS. 7 and 8. The gear shift mechanism 160 includes a slidable shaft 170 axially movable along the center longitudinal axis of the shaft in the register plates 36, 38 and 40 in parallel relationship with the adjacent shafts 164 and 106. The shaft 106 is not shown in FIGS. 1 and 2 but is shown in position in FIG. 3. The functional relationships of the shaft 106 is further shown in FIGS. 7 and 8. The rear end 178 of the shaft 170 is biased forward by a leaf spring 172 having a fixed end attached to the back of the plate 40 and a free end engaging the rear end 178 of the shaft 170. The forward end 173 of the shaft 170 extends beyond the front dial plate 36 so that the shaft can be pushed rearward against the biasing of the leaf spring 172 as shown in the alternative operative position thereof in FIG. 8.

The two alternative positions of the shaft 170 shown in FIGS. 7 and 8 produce gear ratio changes so that in the FIG. 7 position also shown in FIGS. 1 and 2, the pointer shaft 106, shown in FIGS. 3 and 7, is driven in a one to one ratio by the shaft 164. In the rearward position of the shaft 170 shown in FIG. 8, the pointer shaft 106 is driven in a ten to one ratio by the shaft 164. To produce the aforementioned gear ratio changes, the slidable shaft 170 carries the gear 175 in idling or overriding fashion for meshing with the gear 168 and meshing a gear 176 fixed to the shaft 106 when the shaft is in the axially outward position of FIGS. 1, 2 and 7. Two additional idling or overriding gears 179 and 180 are included on the shaft 170. In one working embodiment of FIGS. 1 and 2 the gears 175, 179 and 180 are fixed to each other by being fixed to a common sleeve, not shown, freely rotatable on the shaft 170. A further gear 182 is fixed to the shaft 106. Accordingly, the rearward position of the shaft 170, shown in FIG. 8, effects meshing engagement between gears 166 and 179 and between the gears 180 and 182 and disengagement of the gear 175 with the two gears 168 and 176 of the shafts 164 and 106, respectively. As shown in FIG. 7, the forward position of the shaft 170 disengages the gears 179 and 180 thereof with the gears 166 and 182, respectively, when its gear 175 is engaged with the gears 168 and 176.

The forward and rearward conditions of the gear shift mechanism 160 is uniquely provided by the present invention by the arrangement of a flat auxiliary dial plate 184 shown in one position mounted to the plate 36 in FIG. 3. The auxiliary dial plate 184 has alternative and flipped over positions with its opposite short side end edges reversed as shown in the separate illustration thereof in FIG. 4. Four aligned shaft end clearance holes 186, 187, 188, and 189 surround the shafts 106, 110, 111 and 112 in either of reversed orders when mounted in either of the two reversed auxiliary dial plate positions. The two positions of the auxiliary dial plate 184 are secured by the screws 191 and 192 received by the holes 193 and 194 in either of the two opposite combinations. A further clearance hole 196 is aligned in a common horizontal axis with the shaft clearance holes 186 through 189, inclusively, so that when the auxiliary dial plate 184 is in the mounted position of FIG. 3, the end 173 of the shaft 170 is biased through the hole 196 to the forward position thereof and the gear shift mechanism 160 assumes the position shown in FIGS. 1, 2 and 7. The clearance hole 196 is not necessarily limited to being in alignment with the clearance holes 186 through 189 inclusively other than when the shaft 170 happens to be aligned with the shafts 106, 110, 111 and 112 as it is in the embodiment shown in FIGS. 1, 2 and 3.

Figure 4:
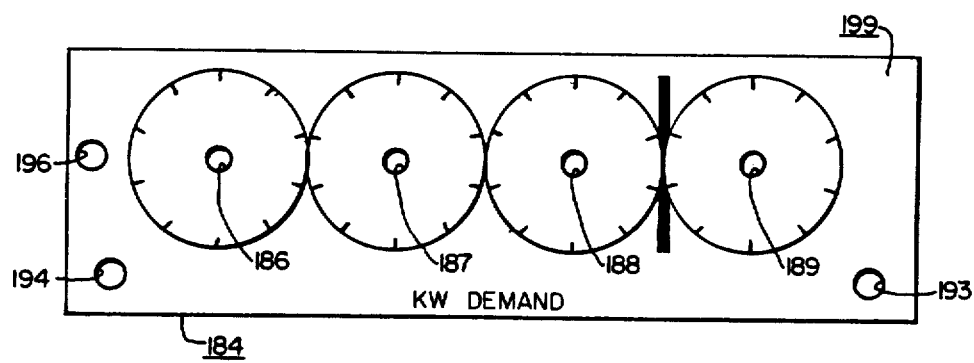
FIG. 4 is a front view of an auxiliary dial plate reversed from the position shown in FIG. 3.

When the auxiliary dial plate 184 is attached to the front plate 36 with the exposed dial face 199 position shown in FIG. 4, the hole 196 is on the lefthand side and displaced from the coaxially aligned orientation with the shaft end 173 as shown in FIG. 3. Accordingly, the plate 184 presses against the shaft end 173 and shifts the shaft 170 rearward so that it assumes the position shown in FIG. 8. The dial indicia on both sides of the auxiliary dial plate 184 includes four circular decimal indicating dial markings surrounding the shaft clearance holes 186 through 189 on each side. The face 198 of the auxiliary dial plate 184 has the hole 196 on the righthand end as viewed in FIG. 3 and is designated with the legend KILOWATTHOURS and more particularly MID PEAK KILOWATTHOURS. The second set of dial indicators 84 will be rotated at the same watthour measuring rate as is the first set of dial indicators 82 since the gear shift mechanism 160 has the forward position with the slidable shaft end 173 extending through the hole 196. A dial face 199 of the auxiliary dial plate 184 is shown in FIG. 4 and has the hole 196 oriented on the lefthand end thereof and is designated the legend KW DEMAND. The mounting of the face 199, so as to be exposed causes the rearward shifted condition of the gear shift mechanism 160. The second set of dial indicators 84 are caused to be rotated at a rate ten times faster to improve the resolution of the KW demand readings. The dial markings of both faces 198 and 199 include ON and OFF legends at the lefthand end of each to be associated with the on-off dial indicator 154 which was briefly noted hereinabove and is explained in detail below.

To convert the register 16 from one to the other of the KWH and KW maximum demand modes of operation, the split pointers 90 are removed from the shafts 106, 110, 111 and 112. The screw fasteners 191 and 192 are removed and the auxiliary dial plate 184 is flipped over end for end. The screws 191 and 192 are then reassembled in the reversed order of the holes 193 and 194 and again fastened to the front plate 36. The operative condition of the gear shift mechanism 160 is automatically and concurrently conditioned by mounting of the auxiliary dial plate 184 to provide the dial gear ratios corresponding to the KWH or KW demand parameters to be measured and indicated by the dials of the corresponding exposed face of the auxiliary dial plate 184.

To enable the register 16 to effect maximum KW demand mode of operation, the second gear train 72 must connect and disconnect the meter movement 12 from the second set of dial indicators 84 in a predetermined timed manner. A circuit 204, shown in FIG. 9 and preferably included in the solenoid control unit 14 shown in FIG. 1, is exemplary of one contemplated manner of a desired cumulative maximum demand type of measuring operation. The circuit 204 provides selective control of the clutch mechanism 118 via the solenoid actuator 126 included in the second dial gear train 72. The function of the circuit 204 is to cause the dial gear train 72 to be initially coupled to the meter movement 12 for a predetermined demand interval time, which are conventionally fifteen, thirty or sixty minute intervals, at the beginning of a demand billing period. Each time the KW demand is measured in one demand interval which exceeds the highest KW measured demand of any previous demand interval, the second gear train 72 is recoupled, by solenoid control of the clutch mechanism 118, to the second set of dial indicators 84 until the end of that demand interval. Thus, the second set of dial indicators 84 provides KW maximum demand readings at the face 199 of the auxiliary dial plate 184. The demand readings are cumulative in a known manner with the maximum demand of a present billing period being accumulated in addition to the total of all previous maximum demand readings as understood by those skilled in the art of electric energy demand billing measurements.

Figure 9:
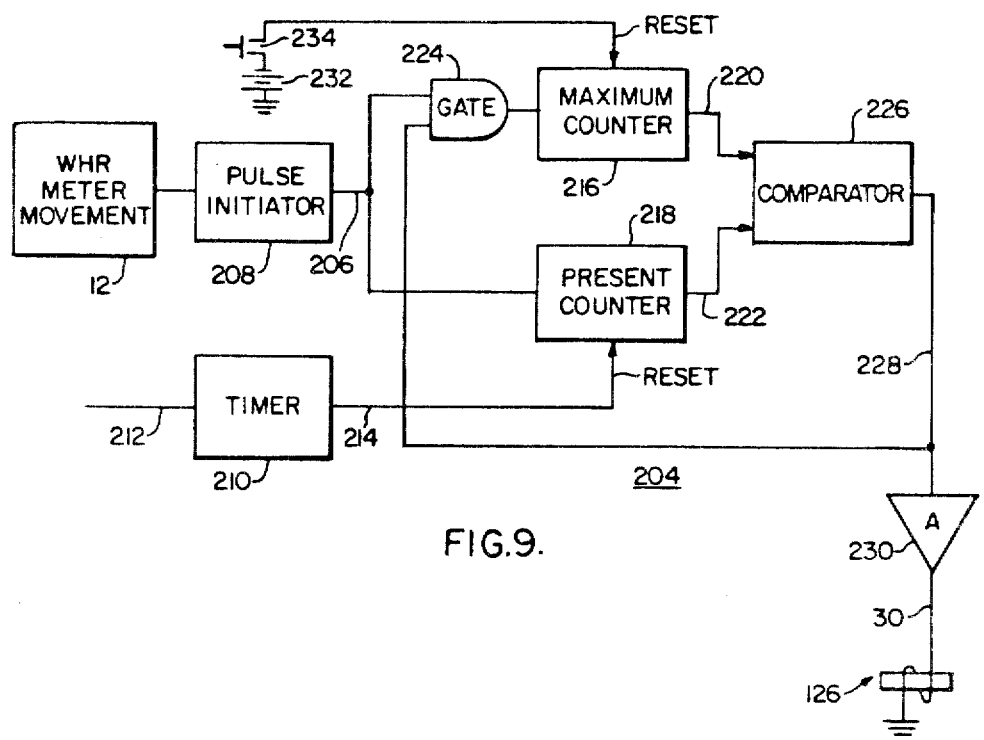
FIG. 9 is an electrical schematic diagram of a portion of a solenoid control circuit shown in FIG. 1.

More specifically, the circuit 204 in FIG. 9 receives pulses on a line 206 wherein each pulse represents a predetermined value of KWH from a conventional pulse initiator 208 driven by the watthour meter movement 12. A clock timer circuit 210 is preferably connected to the sixty Hz power conductors 18 and 20 to receive sixty Hz reference signals and includes conventional divider circuits to produce pulses derived from the reference signals at an output line 214 so as to have a repetition rate the same as the selected demand interval, typically fifteen, thirty, or sixty minutes as noted above. Two pulse counters 216 and 218 are provided having plural stage binary outputs provided on the output lines 220 and 222, respectively. The present measured demand counter 218 receives the KWH pulses from the line 206. The counter 218 is reset to a zero binary count with each occurrence of an interval reset pulse from the line 214. The maximum measured demand counter 216 receives the KWH pulses from the line 206 and the gate 224 when it is enabled. A binary comparator 226 receives the two binary counts of the lines 220 and 222. The comparator output line 228 has either of two logic states and is connected to the enabling input of the gate 224 and to a solenoid driver amplifier 230. The solenoid actuator 126 is then connected for control in the demand metering mode of operation. One logic state at the comparator 226 is produced when the binary output of the counter 218 is equal to or above the binary output of the counter 216 so that the counters are simultaneously receiving KWH pulses from the line 206. Concurrently, the solenoid actuator 126 is energized to effect the coupling state at the clutch mechanism 118 and provide activation of the set of dial indicators 84.

When the binary count of the counter 218 is less than the count of the counter 220, the KWH pulse input to the counter 216 is disabled and the clutch mechanism 118 is in the uncoupled state. Thus, the counter 216 maintains a binary count corresponding to the measured maximum demand of each billing period while the counter 218 has a binary count corresponding to the measured demand of each individual demand interval. The reset input to the counter 216 is connected to a source 232 through a switch 234 to reset the count thereof to zero at the beginning of each demand billing period. As noted above, simple signal sources are also provided in the solenoid control unit 14 for selective energization of the solenoid actuators 118 and 120 for on peak and mid peak KWH modes of measuring operation by the second and third sets dial gear train 72 and 74. Known time control switches are further examples of known devices for producing the selective time energization of the solenoid actuators 118 and 120.

Referring now to the on-off dial indicators 154 and 155 shown in FIG. 3 and being associated with the second and third sets of dial indicators 84 and 86, respectively, two identical dial status indicating mechanisms 240 and 242 are provided for operating the on-off dial indicators 154 and 155, respectively. The entire status indicating mechanism 242 is shown in FIG. 1 as it translates the linear and reciprocating movements of the plunger 153 of the solenoid actuator 128 into actuate movements of the pointer 90 associated with the on-off dial indicator 155. The identical status indicating mechanism 240 is partially shown in FIG. 5 and the same operation of the on-off dial indicator 154 in FIG. 1 is provided in response to the plunger 152 of the solenoid actuator 126.

Each of the status indicating mechanisms 240 and 242 include a rotatable shaft 244 and a rotatable shaft 246 shown in FIG. 3 having reduced ends extending through the front dial plate 36 and each carrying one of the pointers 90. Both of these pointer shafts are mounted as is the shaft 246, shown in FIG. 1, parallel to the other shafts of the dial register 16 and rotationally supported at the ends thereof in the front plate 36 and the middle plate 40. Each of the shafts 244 and 246 carries a cam plate fixed thereto such as the cam plate 248 is shown in FIGS. 1 and 6 fixed to the shaft 246. The cam plates 248 are interconnected to the ends of one of the solenoid plungers of the solenoid actuators 128 and 126 by lever wires or thin connecting rods 250 and 251, shown connected to the solenoid actuators in FIG. 5, with the thin rod 250 being more fully shown in FIGS. 1 and 6. The thin rods 250 and 251 are substantially identical and the rod 250 is shown having three 90° offset bends since the shaft 246 is both vertically and horizontally offset from the back end of the plunger 153 and behind the register plate 40. A slot 252, best shown in FIG. 6, is provided in the cam plate 248 to receive the forward end of the rod 250. The rod extends rearwardly through a slot 254 in the plate 40 and is attached to the plunger 153 at its rear end by a pair snap rings 256. The rod 251 is shown similarly attached by means a pair of snap rings 256 to the back end of the armature 152 in FIG. 5. As arranged as described above, the dial status indicating mechanism 242 provides an "on" indication at the dial indicator 155 in FIG. 3 when the solenoid actuator 128 is in the clutch closing position of FIG. 1. Upon clutch opening and can extended movement of the plunger 153, the connecting rod 250 is shifted, as shown by the directional arrow 258 in FIG. 6, to rotate the cam plate 248 and the shaft 246 in the direction of the counter clockwise directional arrow 260. Thus rotated, the shaft 246 positions its pointer 90 to the "off" indication at the dial indicator 155 in FIG. 3. Upon the plunger returning to the cam retracted position of FIG. 1, the rod 250 and cam plate 248 are moved opposite to the directions of the directional arrows 258 and 260, respectively, and the on-off dial indicator 155 returns to the "on" indication of FIG. 3. As noted above, the on-off dial indicator 154 is arranged with the same dial status indicating mechanism which is designated 240 in FIG. 5 and includes the thin rod 251 connected to the back end of the plunger 152 to a cam platelike, not shown, carried on the pointer shaft 244, shown in FIG. 3, of the dial indicator 154. The cam plate on the shaft 244 will be attached thereto so that the shaft 244 is rotated in opposite directions from that of shaft 246 with the cam extended and retracted movements of the solenoid plunger 152. Thus, the dial indicator 154 indicates the same clutch coupling "on" and clutch uncoupling "off" conditions of the dial gear train 72 and associated set of dial indicators 84.

While a preferred embodiment of the present invention has been described hereinabove, obvious modifications and changes apparent to those skilled in the art are contemplated. For example, the third dial gear train 74 can also include a gear shift mechanism such as the mechanism 160 and an additional auxiliary dial plate, such as the dial plate 184, can be provided for the third set of dial indicators 86. A further circuit such as the circuit 204 can be provided in the solenoid control unit 14 to effect demand measurement control of the solenoid actuator 128. Thus, an additional maximum demand measuring feature is available at the set of dial indicators 86 with the easy method of making conversions between time related KWH and KW demand measurements at the register 16 in accordance with the present invention.

We claim:

1. A convertible multirate dial register for meters having a rotatable measuring element responsive to the consumption of a quantity to be measured, said dial register comprising:

a front plate having plural sets of clock dial indicia;

a first set of dial indicators associated with a first set of dial indicia on said front plate;

a first gear train continuously rotated in response to the rotation of said measuring element for driving said first set of dial indicators;

a second set of dial indicators associated with a second set of said dial indicia wherein said second set of indicia are separately mountable to said front plate;

a second gear train including a clutch mechanism operable between coupling and uncoupling states and having an input and an output with said clutch input being driven by said first gear train, and said second gear train further including shiftable gear means having first and second operating positions so as to be driven in response to said clutch output at either of first or second fixed rates of rotation when in said first or second operating positions, respectively, and said shiftable gear means further being in driving relationship with said second set of dial indicators so that said second set of dial indicators is rotatable at the same rate as said first set of dial indicators are rotated when said shiftable gear means is in said first operating position and at a different rate of rotation from said first set of dial indicators when said shiftable gear means is in said second operating position.

2. The convertible multirate dial register as claimed in claim 1 wherein said second set of dial indicia and a third set of dial indicia are each disposed on separate sides of an auxiliary dial plate mountable in either of two positions on said front plate so that either of said second and third sets of indicia are positionable at said second set of dial indicators, and further wherein said shiftable gear means is moved to a different one of said first and second operating positions in response to the two mounted positions of said auxiliary dial plate.

3. A convertible multirate dial register for meters having a rotatable measuring element responsive to the consumption of a quantity to be measured, said dial register comprising:
  plural sets of dials including a first set and a second set of dial indicators;
  first gear train means having an input for being continuously driven by said measuring element and an output driving said first set of dial indicators;
  second gear train means having an input being continuously driven by said first gear train means and an output selectively driving said second set of dial indicators, and
  gear shift means coupled between said input and said output of said second gear train means and having first and second axially shifted operating positions for effecting two predetermined fixed gear ratios between said input and said output of said second geaar train means such that one gear ratio produces the same predetermined rate of rotation at both the first and second dial indicators and such that the other gear ratio produces a different predetermined rate of rotation at said second set of dial indicators than at said first set of dial indicators when said second set of dial indicators is selectively driven.

4. The convertible multirate dial register as claimed in claim 3 including one clutch mechanism including an input and an output operable between coupled and uncoupled states and connected between said input and said output of said second gear train means.

5. The convertible multirate dial register as claimed in claim 4 including a clutch operating means having a reciprocally movable plunger member for effecting said coupled and uncoupled states of said clutch mechanism.

6. The convertible multirate dial register as claimed in claim 5 including an on-off dial indicator controlled by a rotatable shaft having a cam member, and further including a connecting member attached to said plunger member and operatively engaging said cam member so as to effect indicating movement of said on-off dial indicator in response to the reciprocal clutch operating movements of said plunger.

7. The convertible multirate dial register as claimed in claim 4 wherein said clutch operating means includes a solenoid actuator including said plunger member having said connecting member carried by one end thereof and wherein said plunger member includes a further cam member carried by an opposite end thereof and wherein said clutch operating means further includes a pivoted lever arm having a driven end engaged by the plunger cam member and a driving end engaging said clutch mechanism for effecting said coupled and uncoupled states thereof in response to the reciprocal clutch operating movements of said plunger member.

8. The convertible multirate dial register as claimed in claim 3 wherein said gear shift means includes an axially slidable shaft carrying plural gears and has a forward end thereof biased outwardly of the front of said dial register to assume one of said first and second operating conditions thereof.

9. The convertible multirate dial register as claimed in claim 8 including an auxiliary dial plate having a first opening and plural second pointer shaft openings and further having plural dial indicia disposed on opposite faces of said auxiliary dial plate circumscribing each of said plural second openings, and said dial register further including means for mounting said auxiliary dial plate at the front of said dial register so as to outwardly expose either of said faces such that when one face thereof is mounted outwardly said axially slidable shaft is biased through said first opening for effecting said one gear ratio of said gear shift means and further such that when the other face thereof is mounted outwardly said axially slidable shaft is forced inwardly by the engagement one face thereof for effecting said other gear ratio of said gear shift means.

10. The convertible multirate dial register as claimed in claim 8 wherein said auxiliary dial plate includes dial indicia for kilowatthour measurement indications on the one face thereof and includes dial indicia for kilowatt demand indicia on the other face thereof.

11. A convertible multirate dial register for electric energy meters having a rotatable measuring element responsive to the consumption of a quantity to be measured, said dial register comprising:
  a front plate having plural sets of dial indicia;
  a first set of measuring dial indicators associated with a first set of dial indicia;
  a first dial gear train continuously rotated in response to the rotation of said measuring element for driving said first set of dial indicators;
  a second set of measuring dial indicators associated with a second set of said dial indicia;
  a second dial gear train including a first clutch mechanism operable between coupling and uncoupling states and having an input and an output, said input of said first clutch mechanism being driven by said first dial gear train, said second dial gear train further including gear shift means having first and second operating positions being driven in response to said output of said first clutch mechanism at first and second predetermined rates of rotation when in said first and second operating positions, respectively, and said gear shift means being in driving relationship with said second set of dial indicators when in either of said first and second operating positions so that said second set of dial indicator are rotatable at the same rate and at a different rate than are first set of dial indicators in response to said first and second operating positions, respectively, of said gear shift means when said first clutch mechanism is in said coupling state;
  a third set of measuring dial indicators associated with a third set of said dial indicia;
  a third dial gear train including a second clutch mechanism operable between coupling and uncoupling states and having an input and an output, said input of said second clutch mechanism being driven by said first dial gear train, said output of said second clutch mechanism being in driving relationship with said third set of dial indicators such that the first and third sets of dial indicators are driven at the same rate by said first gear train when said second clutch mechanism is in said coupling state.

12. The convertible multirate dial register as claimed in claim 11 including first and second solenoid actuators for effecting the coupling and uncoupling states said first and second clutch mechanisms, respectively, between the coupling and uncoupling states thereof.

13. The convertible multirate dial register as claimed in claim 12 including first and second on-off dial indicators disposed adjacent said second and said third sets of measuring dial indicators, and further including first and second dial indicating mechanisms each having a connecting means for separately connecting said first and second solenoid actuators with said first and second on-off dial indicators.

14. The convertible multirate dial register as claimed in claim 13 wherein each of said first and second solenoid actuators include plungers reciprocally movable in parallel relationship with a first end of each of said plungers effecting the coupling and uncoupling states of said first and second clutch mechanisms and with a second end of each of said plungers connecting one of said connecting means for effecting the corresponding indicating movements at said first and second on-off dial indicators.

15. The convertible multirate dial register as claimed in claim 14 wherein said first and second dial indicating mechanisms include a rotatable shaft carrying a slotted cam member receiving one said connecting means for translating the reciprocal movements of each of said plungers into arcuate movements at said first and second on-off dial indicators.

* * * * *